(12) United States Patent
Hieda

(10) Patent No.: US 6,388,282 B1
(45) Date of Patent: May 14, 2002

(54) SEMICONDUCTOR MEMORY DEVICE AND METHOD OF MANUFACTURE THE SAME

(75) Inventor: Katsuhiko Hieda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/718,389

(22) Filed: Nov. 24, 2000

(30) Foreign Application Priority Data

Nov. 26, 1999 (JP) .......................................... 11-336606

(51) Int. Cl.⁷ ....................... H01L 27/108; H01L 29/76; H01L 29/94; H01L 31/119
(52) U.S. Cl. .................... 257/300; 438/302; 438/303
(58) Field of Search ............................... 257/632, 306, 257/775, 350, 208, 349, 302, 300, 639, 437, 296, 68, 71, 773, 204, 398; 438/694, 697, 248, 210, 249, 788

(56) References Cited

U.S. PATENT DOCUMENTS 6,150,690 A * 11/2000 Ishibashi et al. ............ 257/306
6,278,152 B1    8/2001 Hieda et al.

FOREIGN PATENT DOCUMENTS

JP         11-17116        1/1999

OTHER PUBLICATIONS

Yamamichi et al., "An ECR MOCVD (Ba,Sr)TiO₃ based stacked capacitor technology with RuO₂/Ru/TiN/TiSi_x storage nodes for Gbit–scale DRAMs," IEDM Technical Digest (Dec. 1995), pp. 5.3.1–5.3.4.

Copy of U.S. Patent Application Serial No. 09/105, 030, of Katsuhiko Hieda et al., filed Jun. 25, 1998.

* cited by examiner

*Primary Examiner*—David Nelms
*Assistant Examiner*—Thao P. Le
(74) *Attorney, Agent, or Firm*—Finnegan, Henderson, Farabow, Garrett, & Dunner, L.L.P.

(57) ABSTRACT

A semiconductor memory device includes a transistor having a gate electrode formed above a semiconductor substrate and source and drain regions formed in the semiconductor substrate, a bit line contact formed in an interlayer insulating film formed to cover the transistor and connected to one of the source and drain regions, a storage node electrode contact formed in the interlayer insulating film and connected to the other of the source and drain regions, a bit line contact plug formed on the bit line contact, a storage node electrode contact plug formed on the storage node electrode contact, a bit line formed to connect to the bit line contact plug, and a capacitor storage node electrode formed to connect to the storage node electrode contact plug.

39 Claims, 15 Drawing Sheets

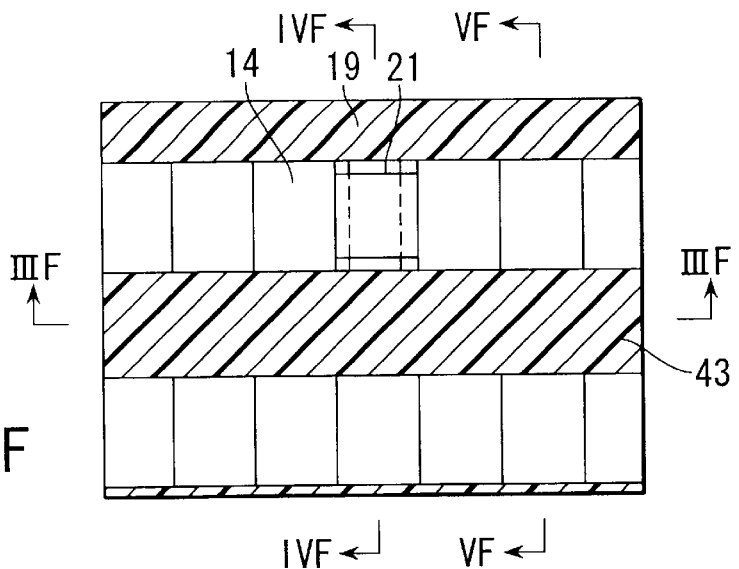
FIG. 2F
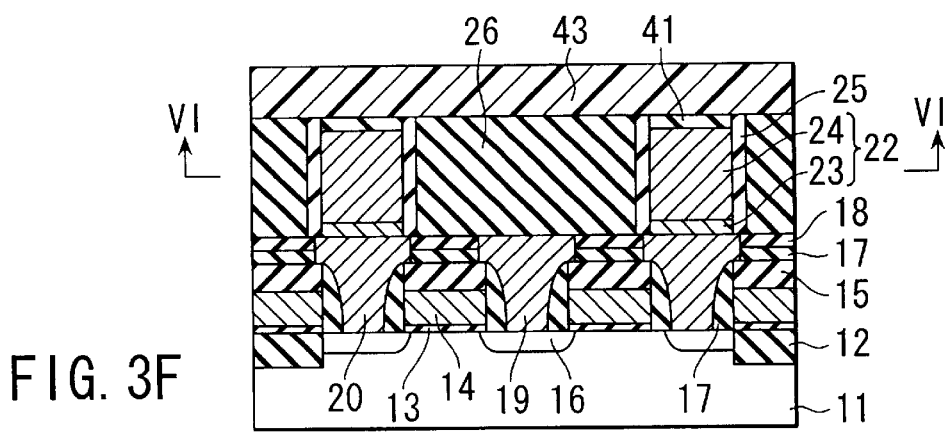
FIG. 3F
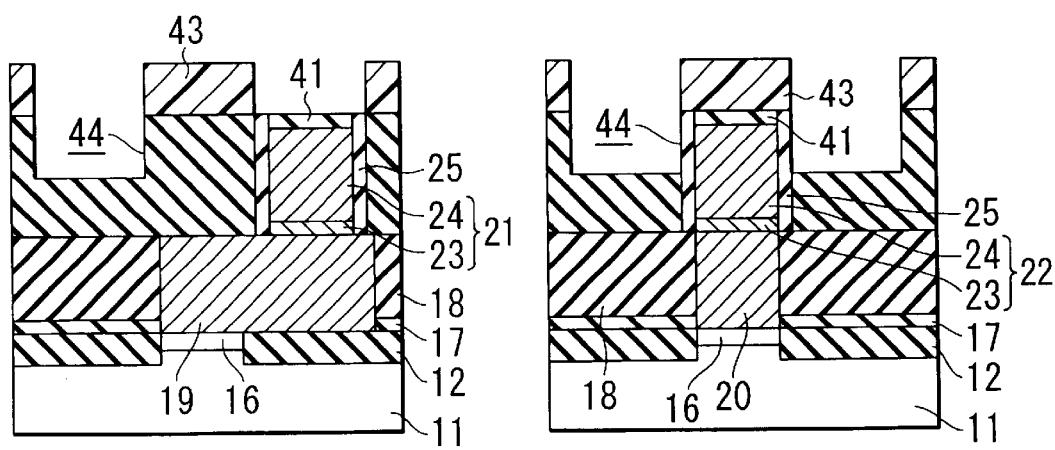
FIG. 4F
FIG. 5F

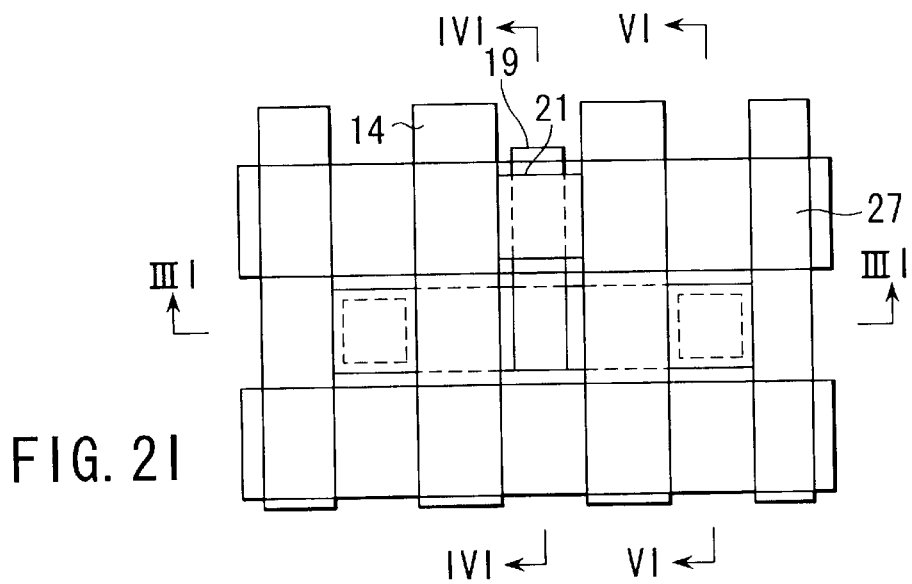
FIG. 2I
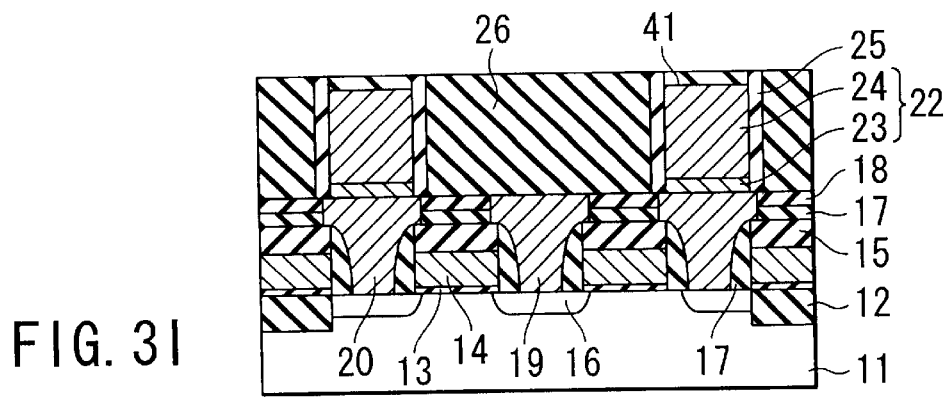
FIG. 3I
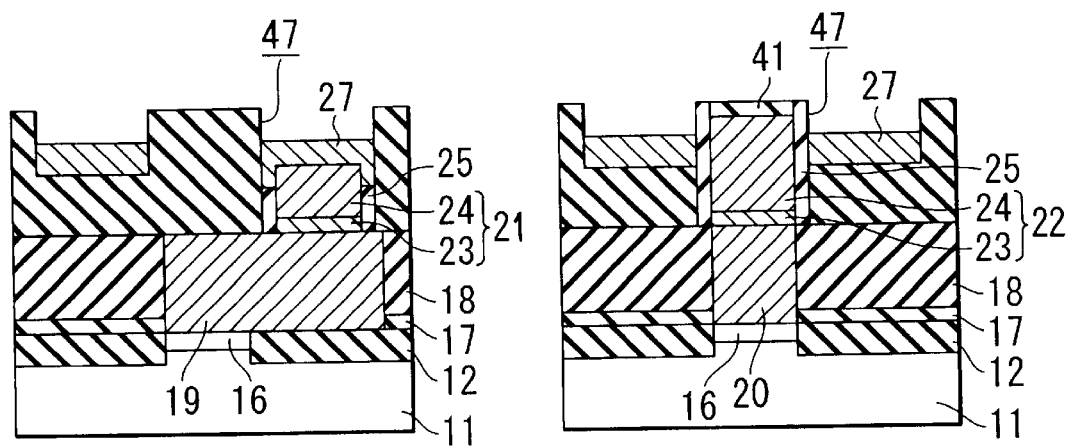
FIG. 4I
FIG. 5I

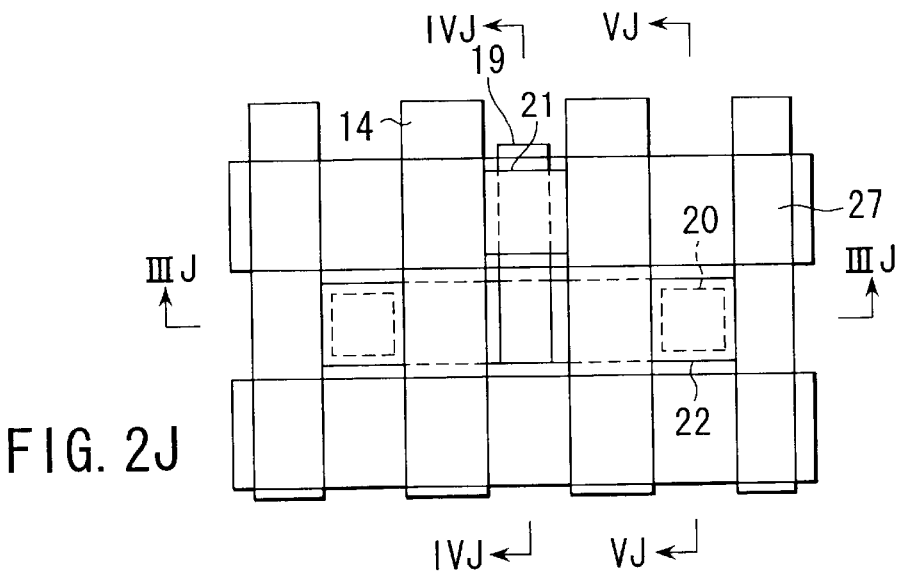
FIG. 2J
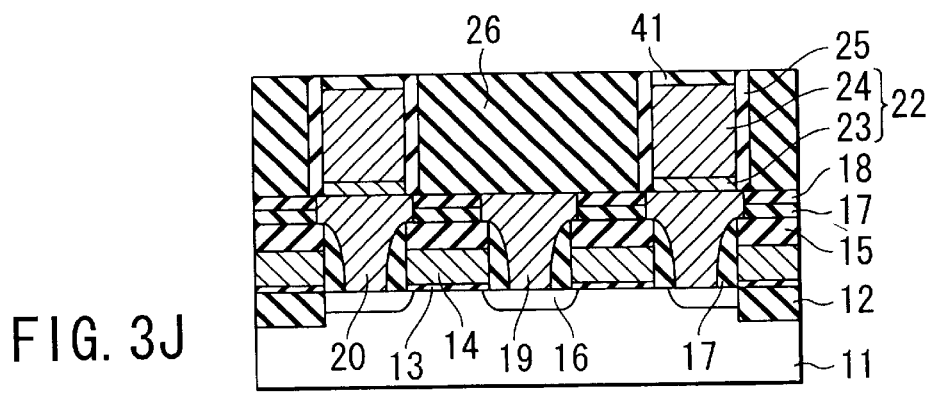
FIG. 3J
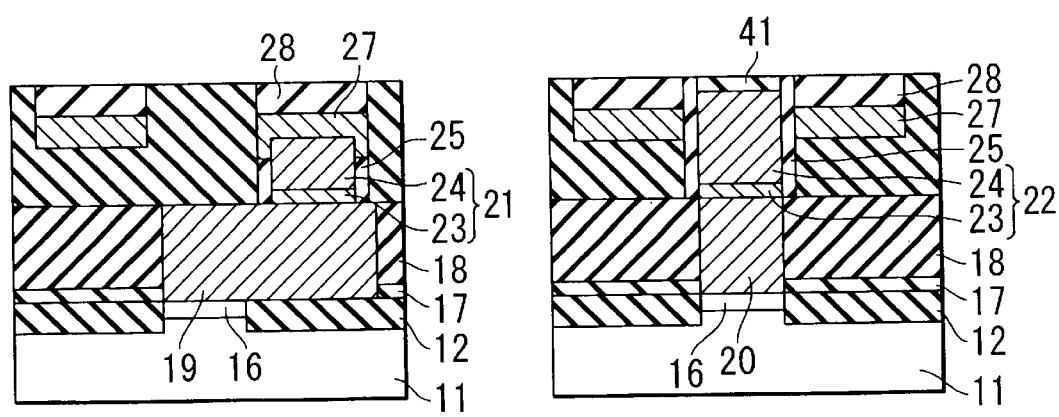
FIG. 4J
FIG. 5J

US 6,388,282 B1

SEMICONDUCTOR MEMORY DEVICE AND METHOD OF MANUFACTURE THE SAME

CROSS-REFERENCE TO RELATED APPLICATIONS

This application is based upon and claims the benefit of priority from the prior Japanese Patent Application No. 11-336606, filed Nov. 26, 1999, the entire contents of which are incorporated herein by reference.

BACKGROUND OF THE INVENTION

The present invention relates to a semiconductor memory device composed of transistors and capacitors and a method of manufacture the same.

In recent years, with increasing packing density of semiconductor integrated circuits, the minimum processing dimensions and the memory cell area keep on shrinking. The area of the capacitor in each memory cell has become increasingly reduced accordingly. A decrease in the memory cell area results in a decrease in the capacitance of the memory cell capacitor (storage capacitance Cs). The storage capacitance is required to have a value larger than a constant value in terms of sensitivity, soft errors, circuit noise, etc. To solve this problem, two methods have been considered: one to increase the storage capacitance by forming the capacitor in three-dimensions to thereby maximize the capacitor surface area, and one to use an insulating film high in permittivity (highly dielectric film) for the capacitor insulating film.

With the generation of design rules of 0.15 $\mu$m or less (the generation of 512-Mb DRAMs and later), the processing of three-dimensional shaped, complex storage node electrodes involves fine-pattern processing and is therefore getting more and more difficult. To increase the storage capacitance, therefore, it has become increasingly important to form storage capacitors in the three-dimensional form and use a high-permittivity insulating film for the capacitor insulating film.

A typical example of the high-permittivity insulating film is a film of (Ba, Sr)TiO$_3$ (hereinafter referred to as a BST film). In the use of a BST film, the use of an Ru film or a composite film of RuO$_2$/Ru for storage node electrodes has been considered (S. Yamauchi et al., IDEM Technical Digest, 1995, pp. 119–122). The Ru film exhibits conductivity even if it is oxidized in the middle of the process because of the use of an oxygen atmosphere in the middle of the formation of the BST film.

Reference is now made to FIG. 7 to describe the stacked DRAM capacitor structure using the composite film of RuO$_2$/Ru as the storage node electrode. After a device isolation layer 12 is formed on a p-type Si substrate 11, a gate insulating film 13, gate electrodes (word lines) 14, a gate capping layer 15, source/drain diffusion layers 16, and a silicon nitride film 17 are formed. A first interlayer insulating film 15 is deposited, then planarized and patterned. After that, plugs 19 and 20 made of polysilicon are buried in regions of storage node electrode contacts and bit line contacts. Later, a second interlayer insulating film 152 is formed and a bit line (BL) 154 is formed on the film 152 so as to connect to the plug 19 through the contact plug 153. After a third interlayer insulating film 155 is deposited, the surface is planarized and storage node electrode contact holes are formed. Storage node electrode contact plugs 156 which maid of n$^-$ type polysilicon are formed in the contact holes. After that, a film of storage node electrode material is formed and then patterned by means of standard photolithographic metal masking and etching techniques using resist to form storage node electrodes 29. After the resist is removed, a capacitor insulating film 31 made of a highly dielectric material, such as a BST film, is formed and then a plate electrode 32 is formed.

In such a memory cell structure, the BL contact plugs and the SN contact plugs are formed separately. In such a case, because the SN contact plugs are placed between the bit lines defined under the minimum design rules, they have to be reduced in size, which will lead to a significant increase in their resistance. For this reason, the speed at which each memory cell is written into or read from may become so unsettled as to affect the cell operation.

BRIEF SUMMARY OF THE INVENTION

It is an object of the present invention to provide a semiconductor memory device and a method of manufacture thereof which permit SN contact plugs to be prevented from increasing in resistance to stabilize the speed at which memory cells are written into or read from.

According to an aspect of the present invention, there is provided a semiconductor memory device comprising: a transistor having a gate electrode formed above a semiconductor substrate and source and drain regions formed in the semiconductor substrate; an interlayer insulating film formed to cover the transistor and having contact holes that lead to the source and drain regions, respectively; a bit line contact formed in one of the contact holes; a storage node electrode contact formed in the other of the contact holes; a bit line contact plug formed on the bit line contact; a storage node electrode contact plug formed on the storage node electrode contact; a bit line formed to connect to the bit line contact plug; and a capacitor storage node electrode formed to connect to the storage node electrode contact plug, and wherein each of the bit line contact plug and the storage node electrode contact plug has a barrier metal layer formed on its associated contact and a metal layer formed on the barrier metal layer, and the barrier metal layer is formed on only the bottom surface of the metal layer.

According to another aspect of the present invention, there is provided a method of manufacturing a semiconductor memory device comprising: a transistor having a gate electrode formed above a semiconductor substrate and source and drain regions formed in the semiconductor substrate; an interlayer insulating film formed to cover the transistor and having contact holes that lead to the source and drain regions, respectively; a bit line contact plug formed on the interlayer insulating film and electrically connected to one of the source and drain regions; a bit line formed to connect to the bit line contact plug; a storage node electrode contact plug formed on the interlayer insulating film and electrically connected to the other of the source and drain regions; and a capacitor storage node electrode formed to connect to the storage node electrode contact plug, characterized by forming the bit line contact plug and the storage node electrode contact plug simultaneously.

According to still another aspect of the present invention, there is provided a method of manufacturing a semiconductor memory device comprising the steps of: forming a transistor having a gate electrode and source and drain regions in a semiconductor substrate; forming a first interlayer insulating film to cover the transistor above the semiconductor substrate; forming contact holes in the first interlayer insulating film which lead to the source and drain regions, respectively; forming a contact in each of the contact holes; depositing a barrier metal film and a metal film in sequence on the first interlayer insulating film; patterning the barrier metal film and the metal film to form a bit line contact plug and a storage node electrode contact plug, the bit line contact plug being electrically connected to one of the source and drain regions and the storage node electrode contact plug being electrically connected to the other of the source and drain regions; forming an insulating film on the sidewall of each of the bit line contact plug and the storage node electrode contact plug; forming a second interlayer insulating film on the first interlayer insulating film to isolate the bit line contact plug and the storage node electrode contact plug from each other; forming a trench in the second interlayer insulating film which leads to the bit line contact plug; forming a bit line in the trench; forming an insulating film on the top of the bit line; forming a storage node electrode on the second interlayer insulating film which connects to the storage node electrode contact plug; forming a dielectric film to cover the top of the storage node electrode; and forming an upper electrode to cover the top of the dielectric film.

The present invention provides the following advantages:

In the SN contact plug, since the barrier metal layer of high resistivity is formed on only the bottom surface of the metal layer in a self-aligned manner, the manufacturing process can be simplified and the resistance of the plug can be reduced.

The manufacturing process can be simplified by forming the bit line contact plug and the SN electrode contact plug simultaneously.

Since the SN contact plug is formed prior to the formation of the bit line, the shape of the SN contact can be formed without being affected by variations in the processing of the bit line and the SN contact plug of low resistivity can be formed stably.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A through 2M are plan views, in the order of steps of manufacture, of the memory cell shown in FIGS. 1A through 1D;

FIGS. 3A through 3M are sectional views, in the order of steps of manufacture, of the memory cell shown in FIGS. 1A through 1D;

FIGS. 4A through 4M are sectional views, in the order of steps of manufacture, of the memory cell shown in FIGS. 1A through 1D;

FIGS. 5A through 5M are sectional views, in the order of steps of manufacture, of the memory cell shown in FIGS. 1A through 1D;

DETAILED DESCRIPTION OF THE INVENTION

Figure 1A:
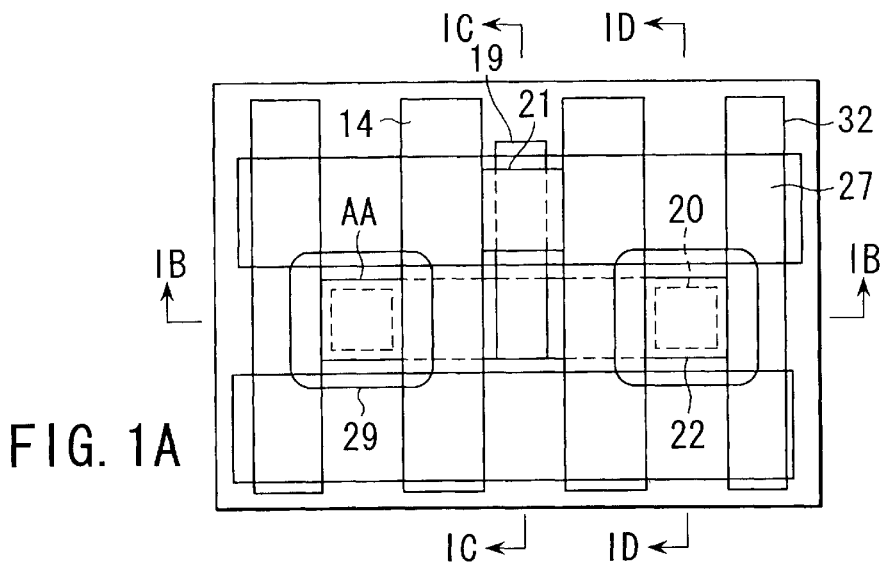
FIGS. 1A through 1D show, in plan and sectional views, the structure of a memory cell of a stacked DRAM according to an embodiment of the present invention.
Figure 1B:
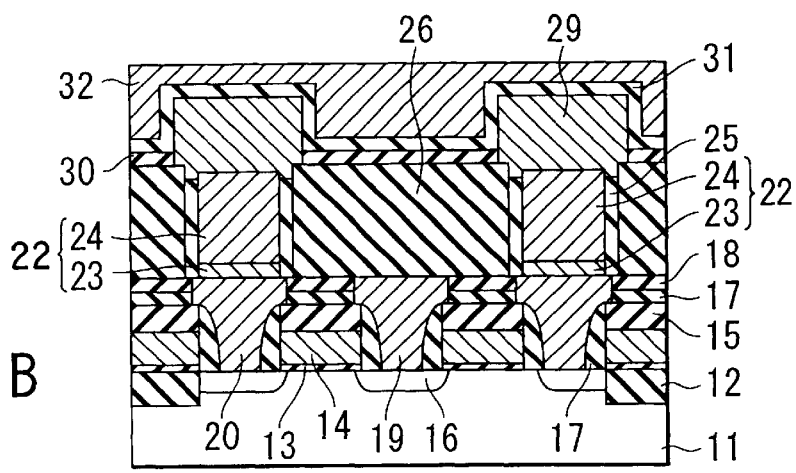
Figure 1C:
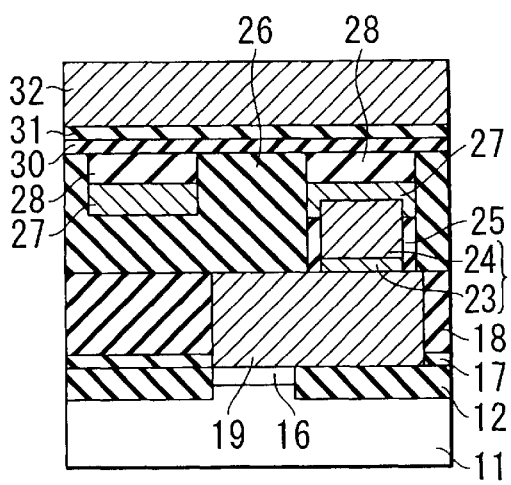
Figure 1D:
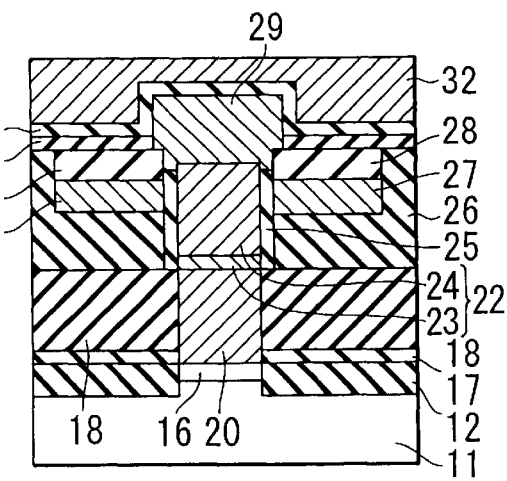
Figure 2A:
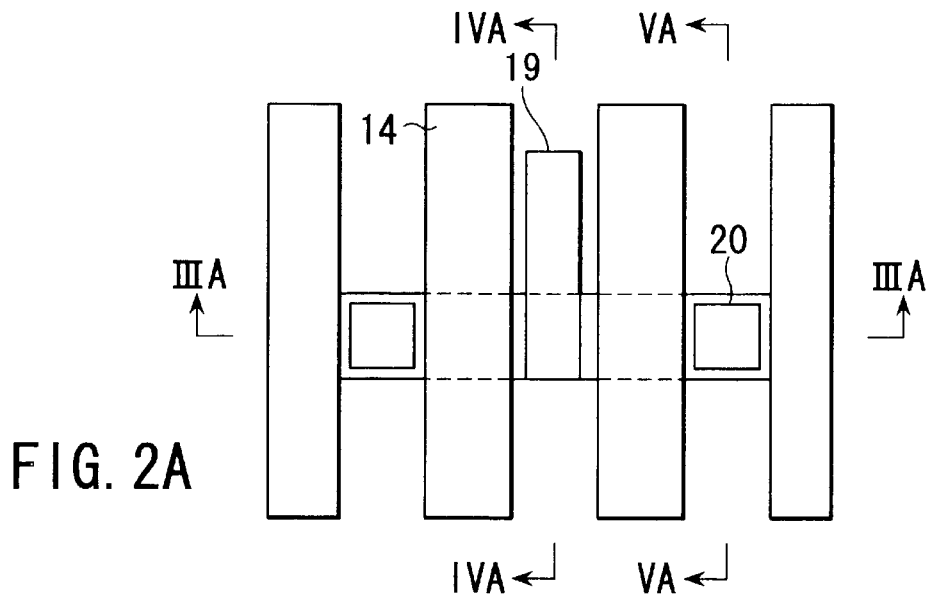
Figure 3A:
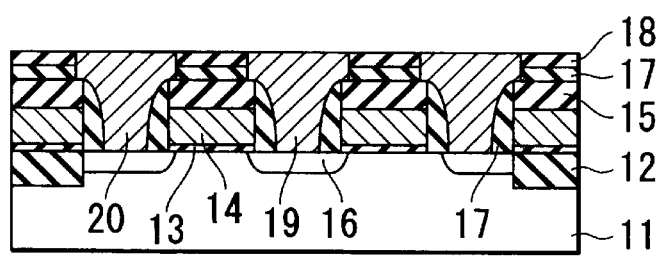

FIGS. 1A through 1D show the structure of a memory cell of a stacked DRAM according to an embodiment of the present invention. More specifically, FIG. 1A is a plan view of the DRAM memory cell, FIG. 1B is a sectional view taken along line I B—I B of FIG. 1A, FIG. 1C is a sectional view taken along line I C—I C of FIG. 1A, and FIG. 1D is a sectional view taken along line I D—I D of FIG. 1A.

The stacked DRAM of the present embodiment remains basically unchanged in structure from conventional stacked DRAMs except the structures of bit line (BL) contact plugs and storage node electrode contact plugs.

As shown in FIGS. 1A through 1D, in the surface of an Si substrate 11 of p-type conductivity by way of example, there is provided a device isolation layer 12 in which an insulating film is formed to fill trenches. Gate electrodes (word lines) 14 are formed on a gate oxide film 13 formed on the device isolation layer 12 and the Si substrate 11. As the gate electrodes 14 use may be made of a layer of polysilicon only. To reduce the resistance, a polycide structure in which a polysilicon layer and a $WSiO_2$ layer are stacked or Polymetal structure in which a polysilicon layer, a W film and a WN film are stacked can also be used.

A gate capping layer 15, in the form of silicon nitride, is formed on each gate electrode 14. In the surface of the Si substrate 11 in the device region there are formed source/drain regions 16 to sandwich the channel region below the gate electrode 14. In FIG. 1A, AA denotes the active region.

A silicon nitride film 17 is formed to cover the surface of the Si substrate 11 and the stacked structure of the gate electrode 14 and the gate capping layer 15. A first BPSG film 18 having its top surface planarized is formed on the silicon nitride film 17. The silicon nitride film 17 and the BPSG film 18 form a first interlayer insulating film.

In the silicon nitride film 17 and the first BPSG film 18 are formed contact holes that lead to the source/drain diffusion layers 16. In these contact holes are formed a bit line (BL) contact 19 and a storage node electrode contact 20 which are made from polysilicon. The surfaces of the contacts 19 and 20 and the first BPSG film 18 are planarized to be flush with one another.

A BL contact plug 21 is formed on the BL contact 19. An SN contact plug 22 is formed on the SN contact 20. Each of the BL contact plug 21 and the SN contact plug 22 is structured such that a Ti layer 24 lies on a TiN layer 23 serving as barrier metal. Instead of the Ti layer, a W layer may be used. A silicon nitride film ($Si_3N_4$) 25 is formed on the sidewall of the BL contact plug 21 and the SN contact plug 22.

A second BPSG film (second interlayer insulating film) 26 is formed to cover the entire surface. A bit line 27 and a silicon nitride film 28 are stacked in a trench which is formed in the second BPSG film 26 which leads to the BL contact plug 21.

A storage node electrode 29 is formed on the second BPSG film to connect to the SN contact plug 22. A silicon nitride film 30 is formed on that area of the second BPSG film 26 which is not formed with the storage node electrode 29. A capacitor insulating film 31 in which made of a (Ba, Sr) TiO$_3$ film or a SrTiO$_3$ film, is formed to cover the surface of the storage node electrode 29. A plate electrode 32 is formed over the entire surface.

According to the DRAM of the present embodiment, the barrier metal material of high resistivity in the SN contact plug can be formed to self-align to only the bottom surface of the metal plug material, thus allowing the manufacturing process to be simplified and the plug resistance to be reduced.

Next, a method for manufacturing the memory cell shown in FIGS. 1A through 1D will be described. FIGS. 2A through 2M are plan views and FIGS. 3A through 3M, 4A through 4M, 5A through 5M and 6 are sectional diagrams, in the order of steps of manufacture, of a memory cell in a stacked DRAM in accordance with an embodiment of the present invention. FIGS. 2A through 2M, FIGS. 3A through 3M, FIGS. 4A through 4M and FIGS. 5A through 5M correspond in cell region to FIG. 1A, FIG. 1B, FIG. 1C and FIG. 1D, respectively. The embodiment is described herein as using an N-channel MOS transistor for each memory cell. The manufacturing method applies to the case where a P-channel MOS transistor is used.

First, as shown in FIGS. 2A, 3A, 4A and 5A, a p well is formed in an n-channel transistor formation region in the surface of a p-type (100) silicon substrate 11 of an impurity concentration of about $5 \times 10^{15}$ cm$^{-3}$ by way of example. In the case of a p-channel MOS transistor, an n well is formed in an n-type silicon substrate. Next, trenches about 0.2 $\mu$m deep are etched into regions other than device regions in the Si substrate 11 through reactive ion etching (RIE) and then filled with an insulating film to form a device isolation layer 12 using so-called shallow trench isolation (STI) techniques.

Next, a gate oxide film 13 of a thickness of about 60 nm is formed as a gate insulating film. In the memory cell area, a gate electrode material layer 14 serving as a word line is deposited. To lower the gate electrode resistance, a polycide gate structure (for example, stacked poly Si/WSi$_2$ films each of about 50 nm thickness) can be used. It is also possible to use a poly Si layer only or stacked poly Si/W films.

Next, a gate capping layer 15 of silicon nitride (Si$_3$N$_4$) is formed on the gate electrode layer 14, which serves as etching stopper in a self-aligned process to be carried later. After that, a resist film (not shown) is formed on gate electrode regions of the gate capping layer 15. Subsequently, the gate capping layer 15 is processed using the resist film as a mask and the resist film is then removed. Using the gate capping layer 15 using a mask, the gate electrode layer 14 is patterned, so that the gate electrode 14 is formed in the memory cell section.

Next, in order to increase the withstand voltage between the gate electrode 14 and lightly doped regions (source/drain diffused regions) to be formed later, rapid thermal oxidation (RTO) is carried out in an oxygen ambient for about 100 seconds at 1050° C. to form a so-called post oxide (not shown) on the surface of the substrate 11.

After the formation of a resist film not shown, using this resist film, the gate capping layer 15 and the gate electrode 14 as mask, n$^-$ type impurity diffused regions serving as the source/drain regions 16 are formed into the surface of the Si substrate 11 by means of ion implantation techniques by way of example.

Next, a silicon nitride film 17 of about 29 nm in thickness is formed over the entire surface by means of LP-CVD techniques. Further, a first BPSG film 18 is formed over the entire surface, by means of CVD to a thickness of about 500 nm. After that, the surface of the first BPSG film 18 is polished and planarized using chemical mechanical polishing (CMP) to a thickness of about 100 nm. By the planarization of the BPSG film 18 through CMP, almost the entire surface of the wafer is smoothed out.

Though not described above, the source/drain diffused regions can also be formed by, prior to the formation of the silicon nitride film 17, depositing a silicon nitride film (Si$_3$N$_4$) of, say, about 20 nm in thickness over the entire surface by means of LP-CVD, selectively etching the silicon nitride film through RIE so that part of that film remains on the sidewall of the gate electrode as a sidewall insulating film (Si$_3$N$_4$), and forming n$^+$ (or p$^+$) impurity diffused regions in desired substrate regions by ion implantation using the resist film, the sidewall insulating film, and the gate electrode as a mask. In this case, a silicon nitride film of, say, 20 nm in thickness is again deposited over the entire surface through LP-CVD to act as a stopper in the subsequent CMP process.

Using a resist film formed on the BPSG film 18 through lithographic techniques as a mask, contact holes are formed for polysilicon plugs each making contact between the source/drain diffusion layer 16 and the corresponding bit line or storage node electrode. The contact holes are formed in a self-aligned manner using RIE of high etch selectivity in which the etch rate for BPSG is ten times or more higher than that for silicon nitride. This prevents the gate electrode 14 and the n$^+$-type polysilicon contact which is filled later in the contact hole from being shorted, allowing the manufacturing yield to be improved.

Figure 4A:
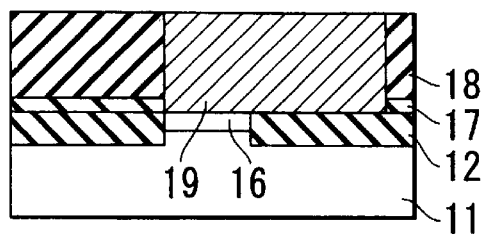
Figure 5A:
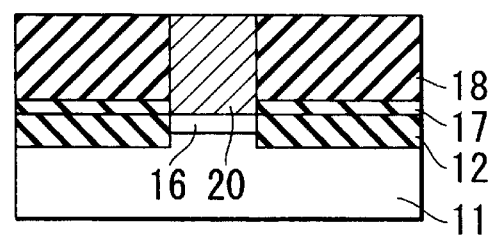
Figure 2B:
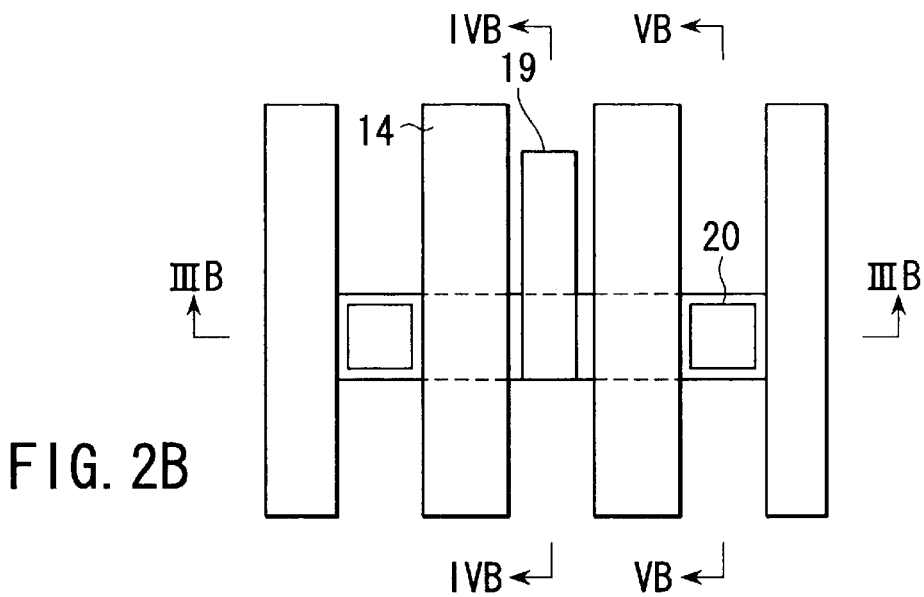
Figure 3B:
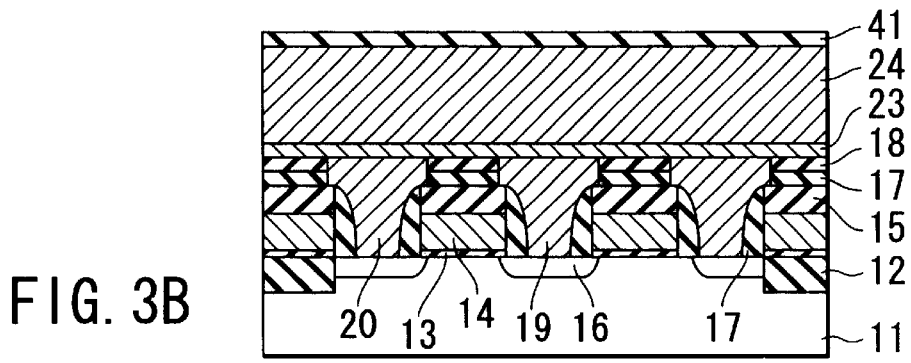
Figure 4B:
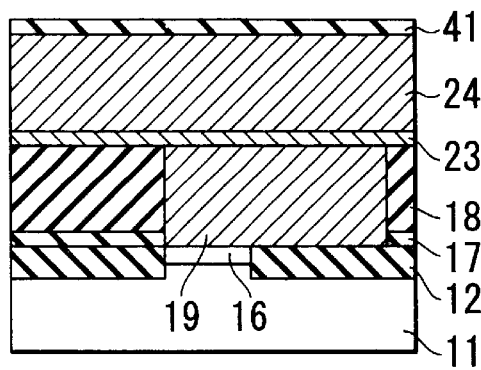
Figure 5B:
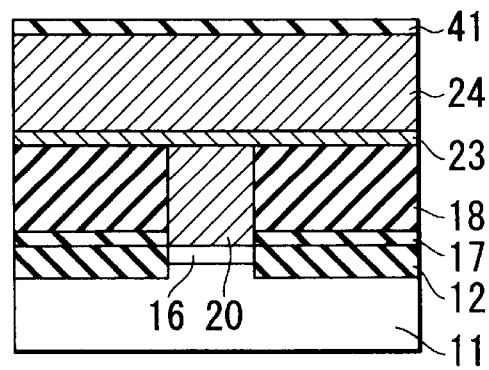
Figure 2C:
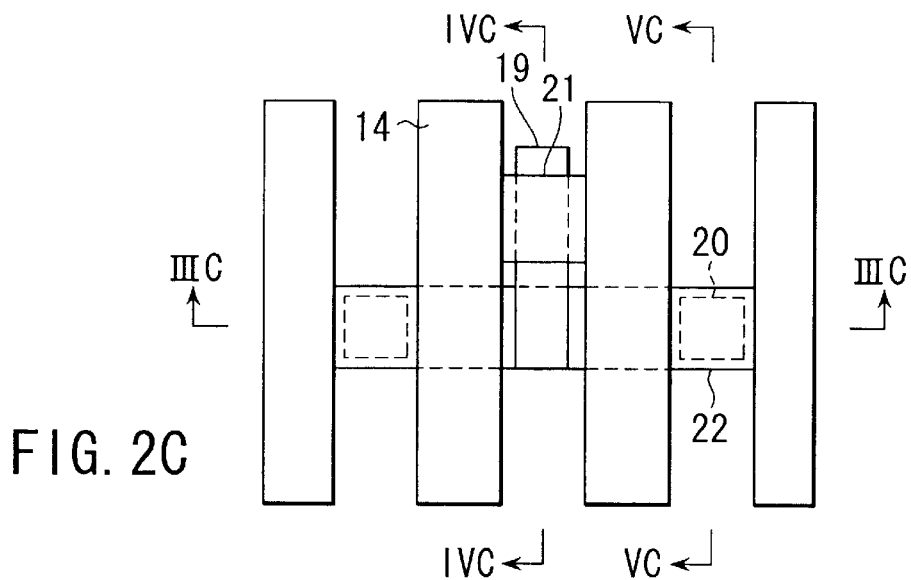
Figure 3C:
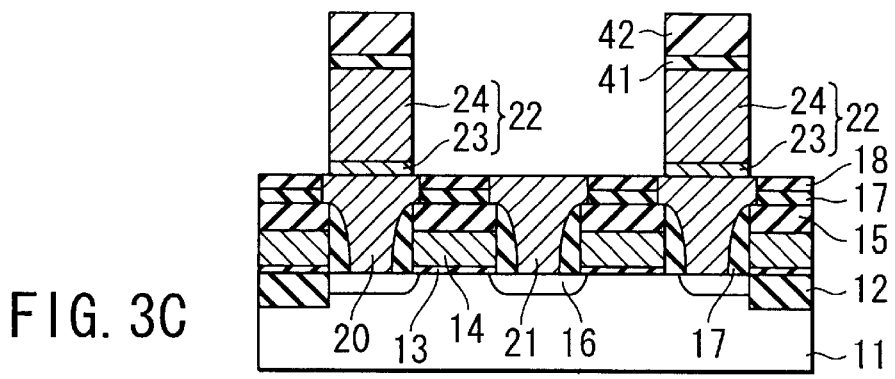
Figures 4C, 5C:
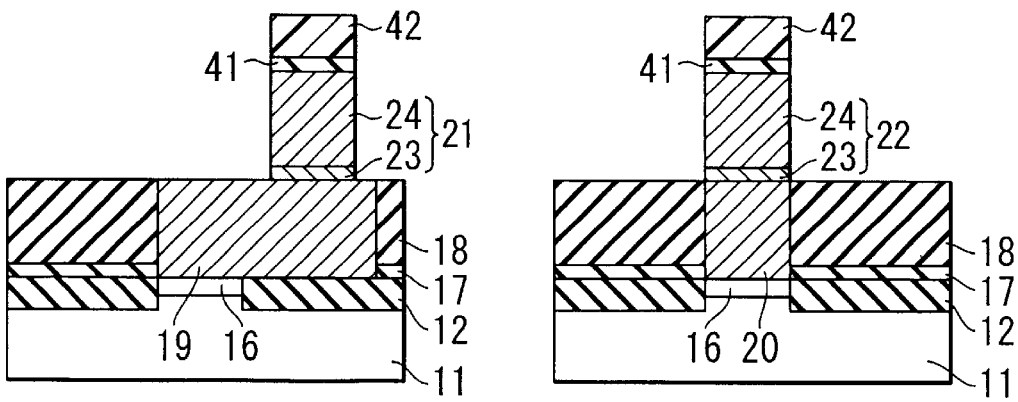
Figure 2D:
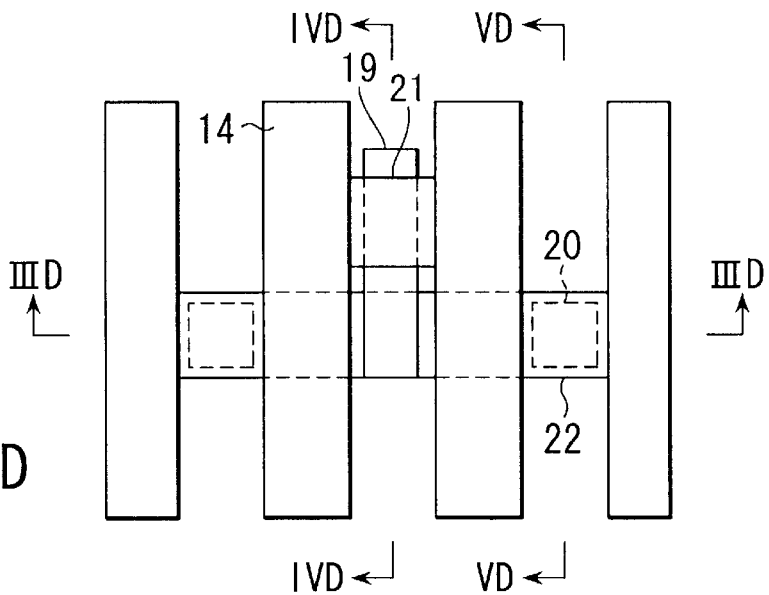
Figure 3D:
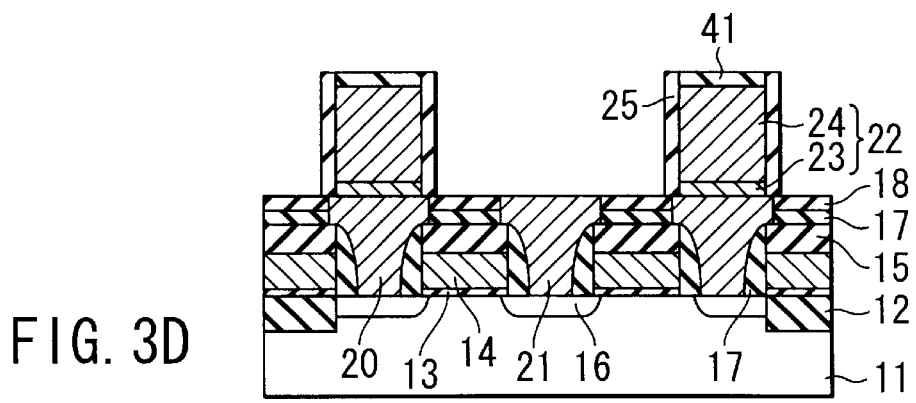
Figure 4D:
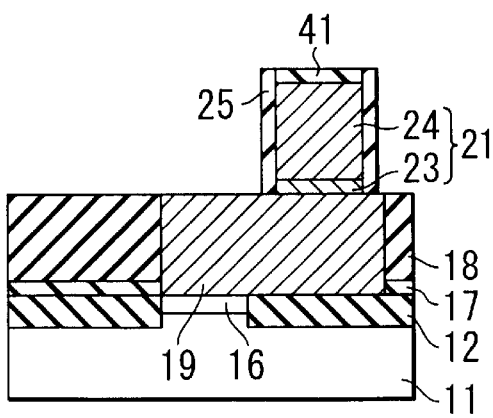
Figure 5D:
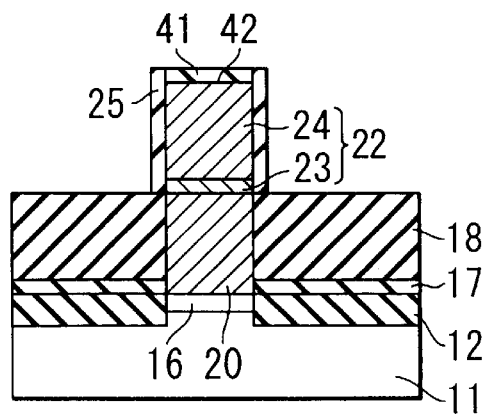
Figure 2E:
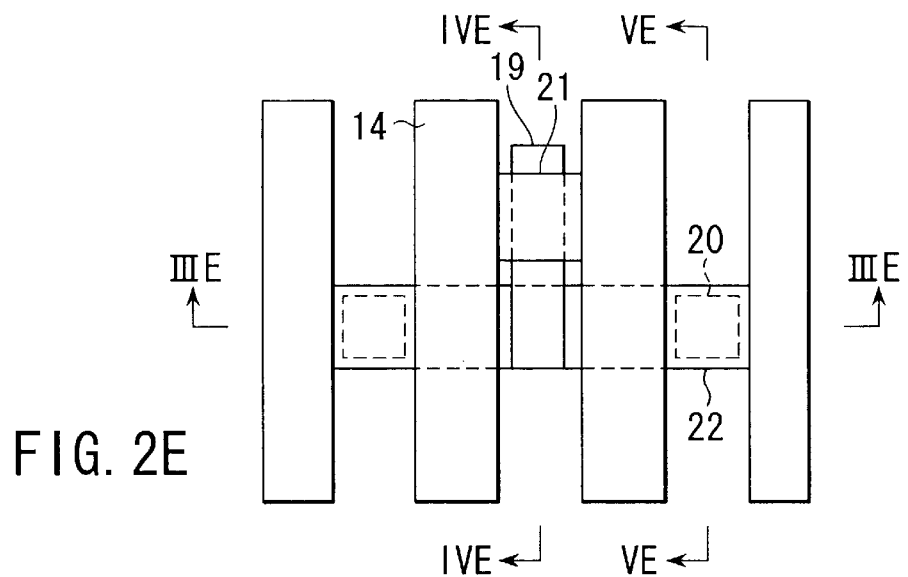
Figure 3E:
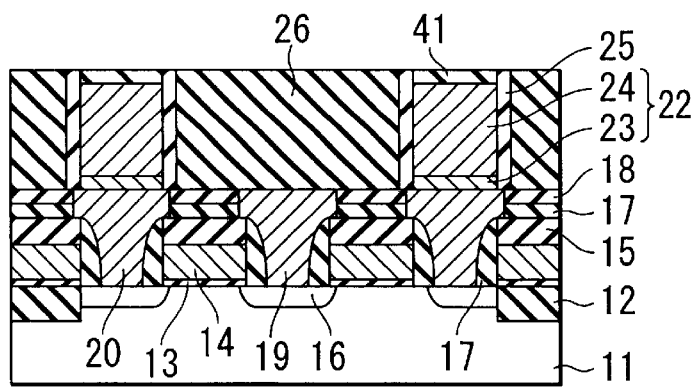
Figure 4E:
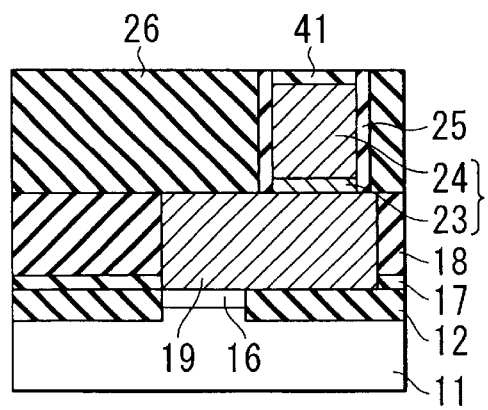
Figure 5E:
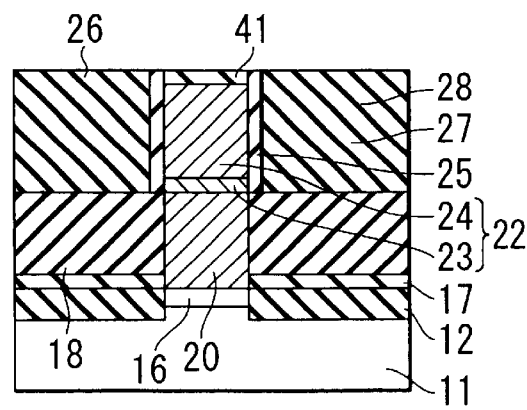
Figure 2G:
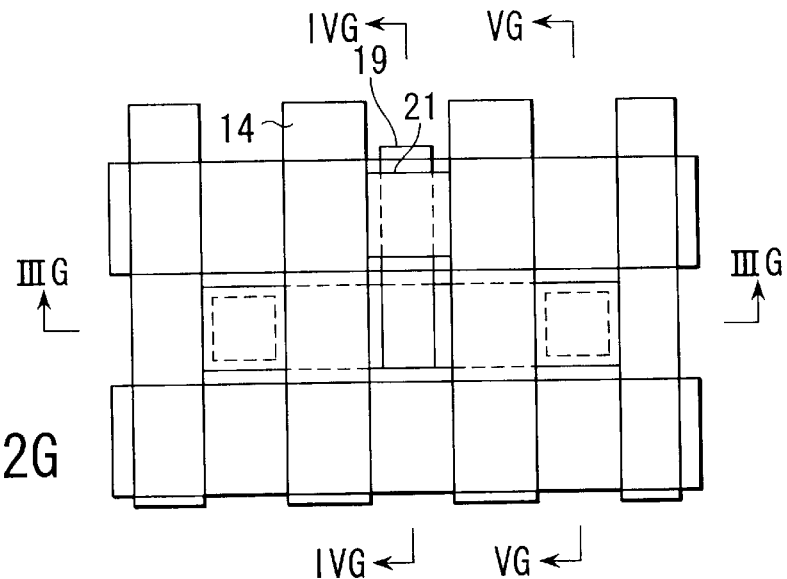
Figure 3G:
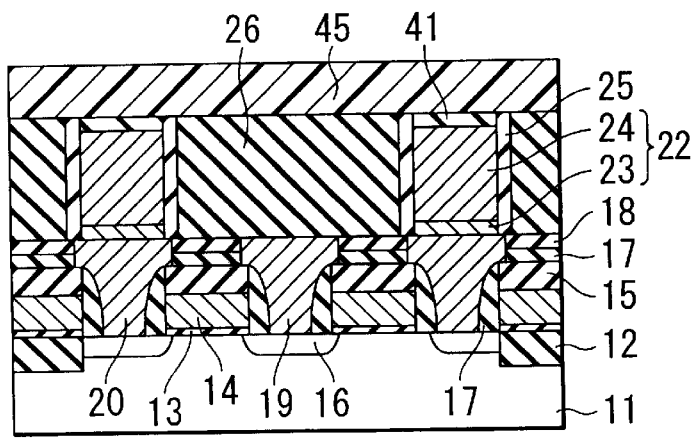
Figure 4G:
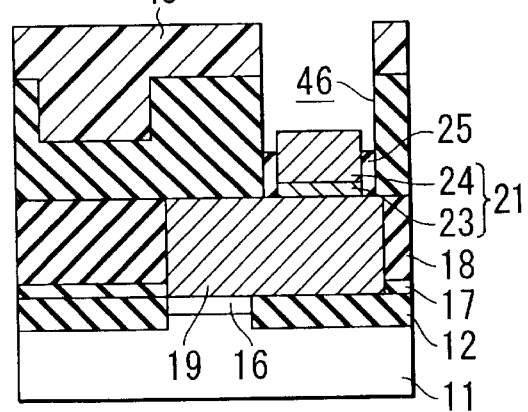
Figure 5G:
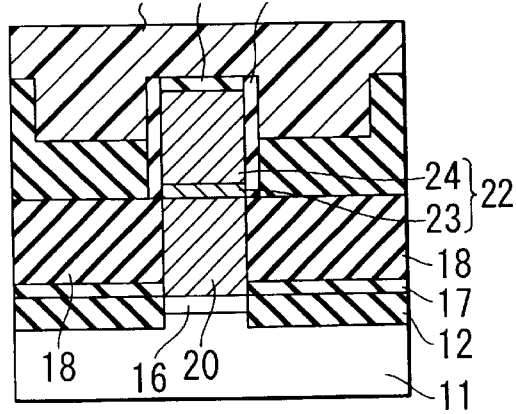
Figure 2H:
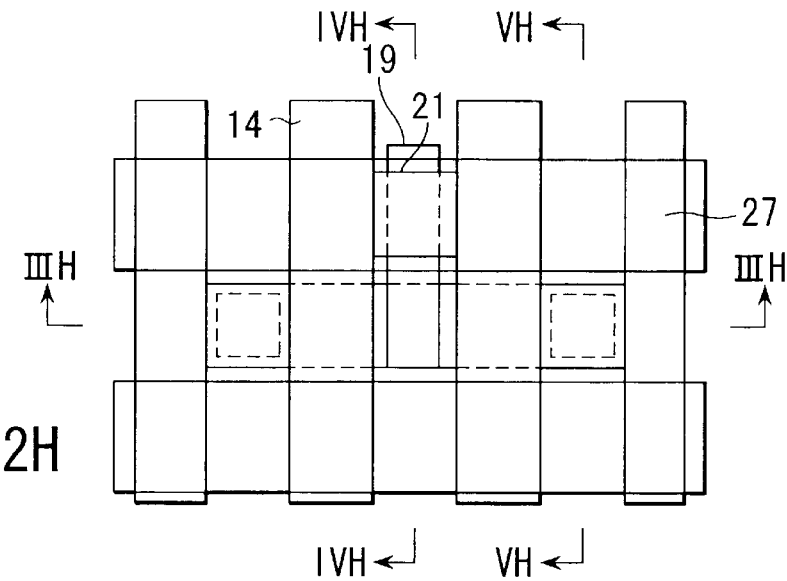
Figure 3H:
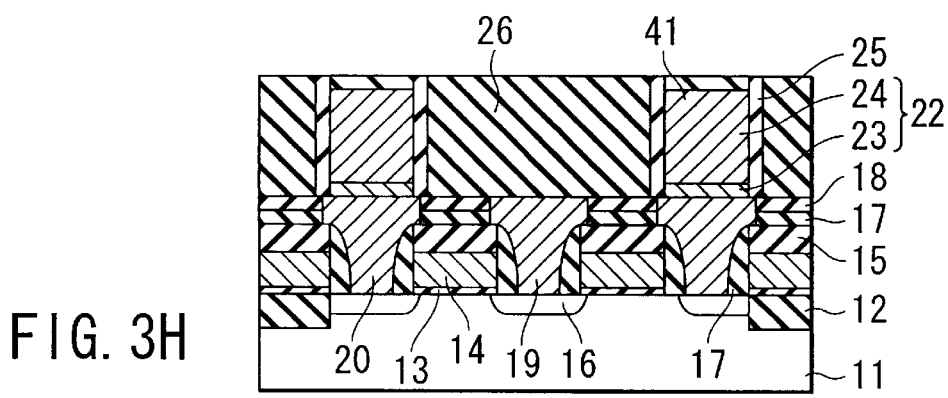
Figure 4H:
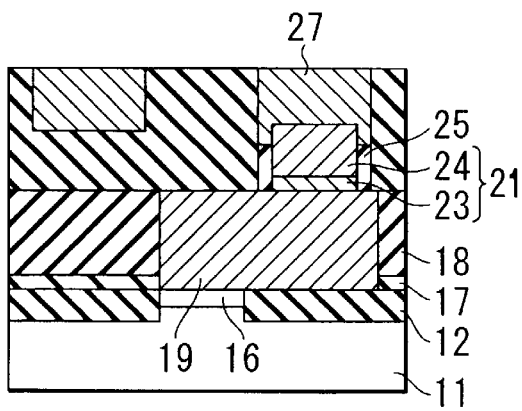
Figure 5H:
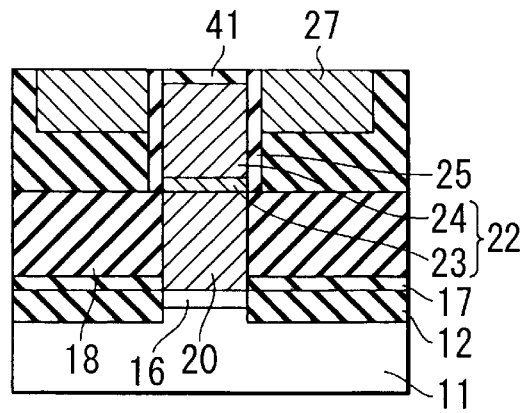
Figure 2K:
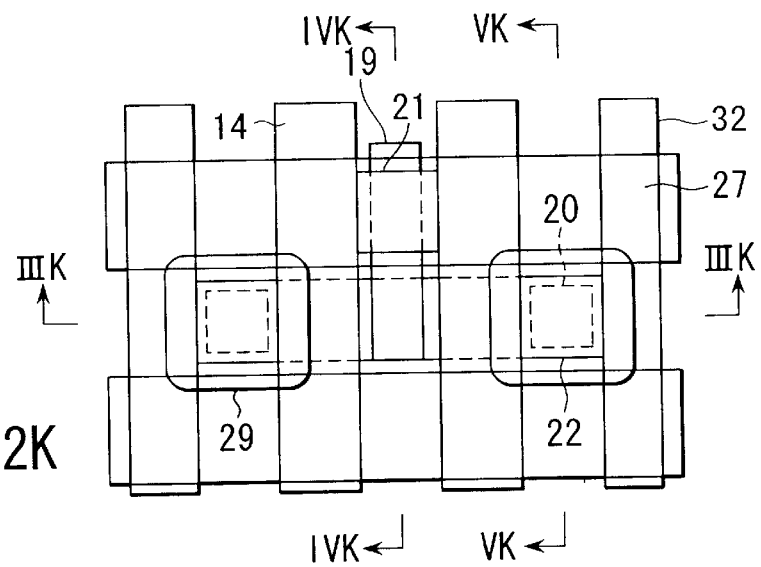
Figure 3K:
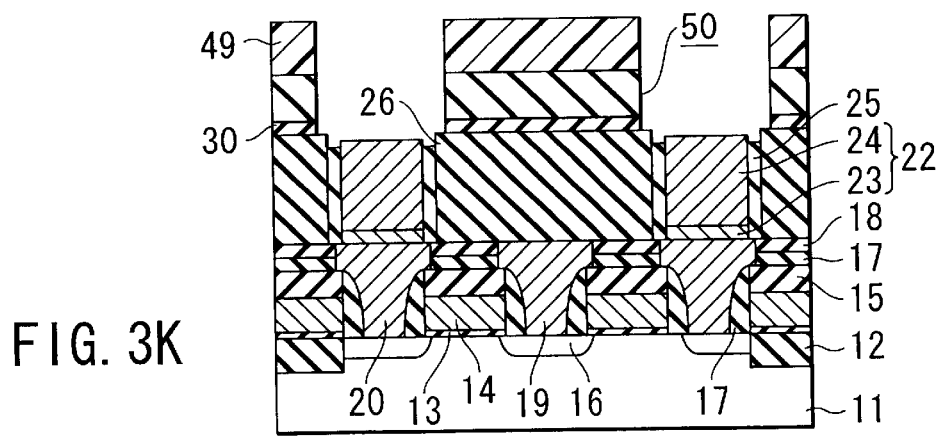
Figure 4K:
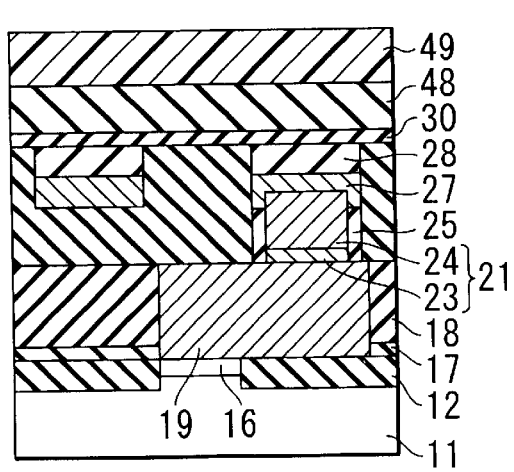
Figure 5K:
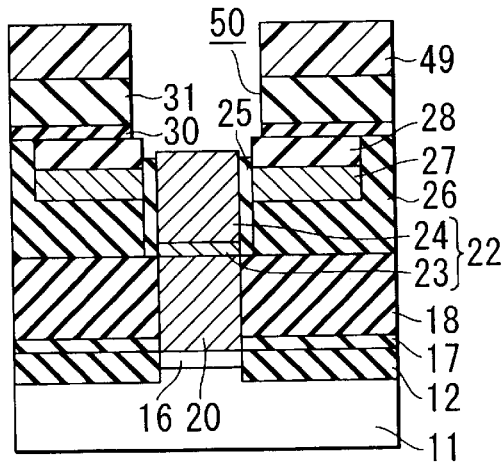
Figure 2L:
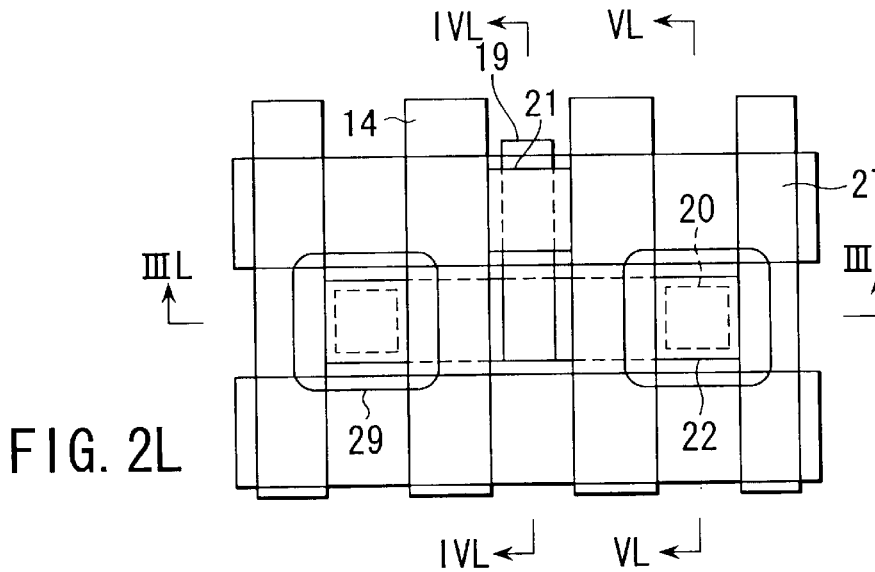
Figure 3L:
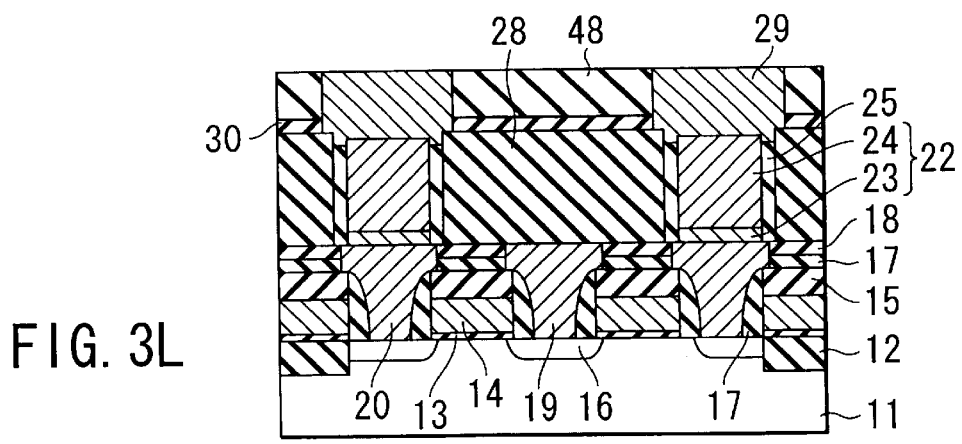
Figure 4L:
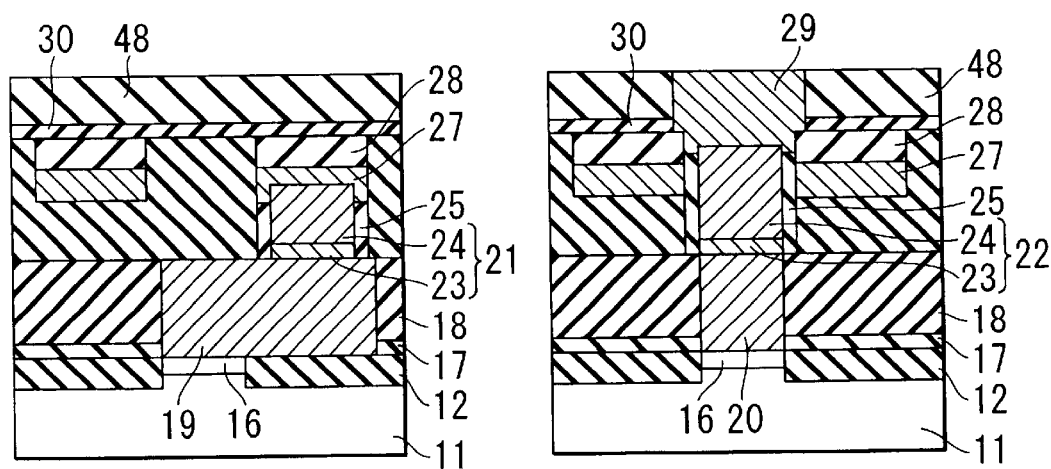
Figure 5L:
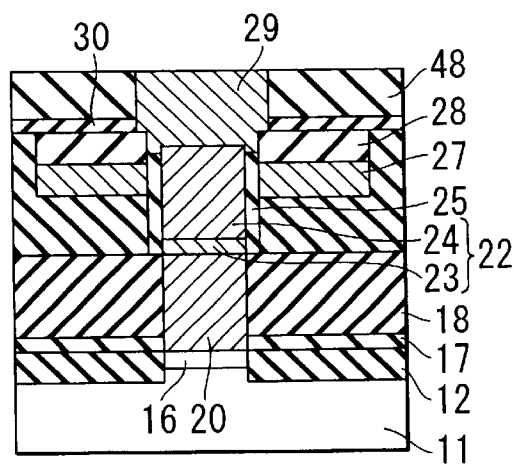
Figure 2M:
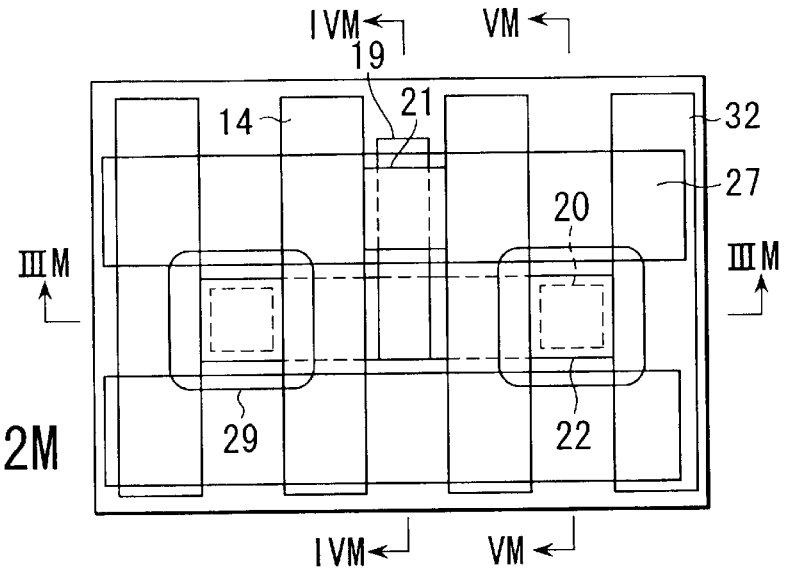
Figure 3M:
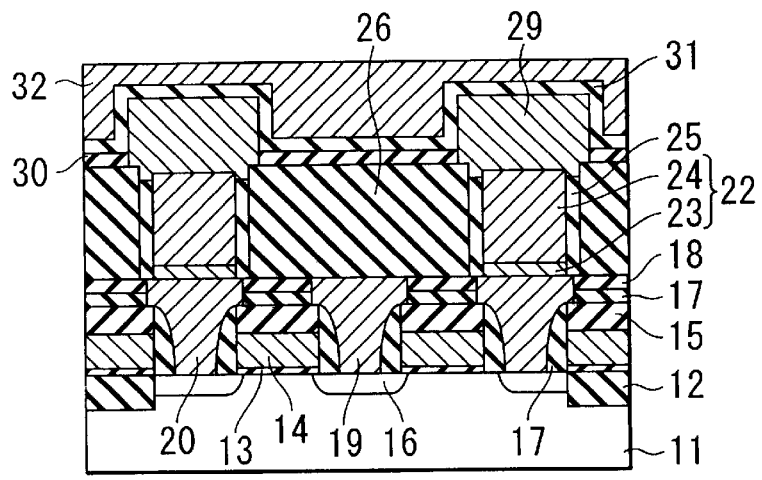
Figures 4M, 5M:
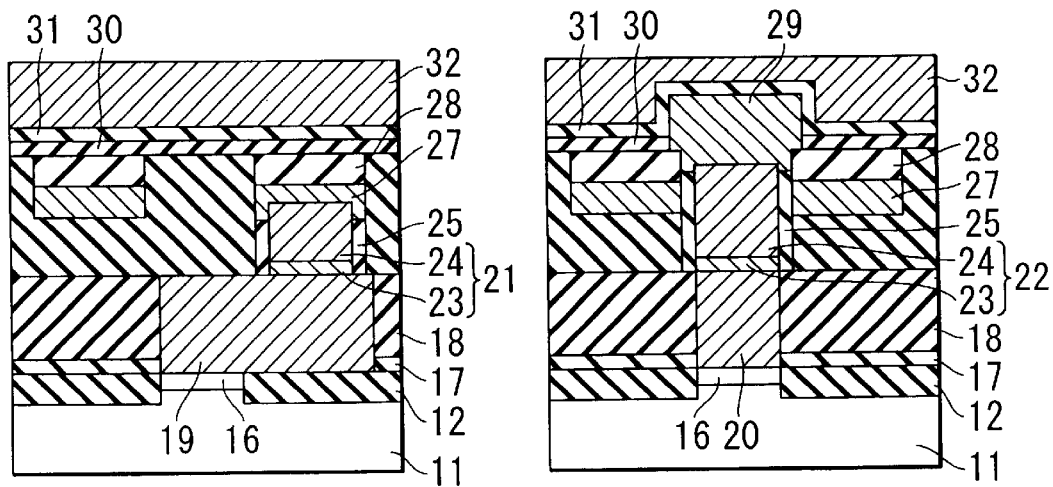

After the removal of the resist film, an n$^+$-type polysilicon layer doped with phosphorus (P$^+$) or arsenic (As$^+$) is deposited over the entire surface by means of LP-CVD and then BL contacts 19 and storage node electrode contacts 20 of n$^+$-type polysilicon are formed to fill the contact holes by means of etchback techniques using CMP or RIE. The contacts 19 and 20 are electrically connected with the source/drain diffusion layers 16. The BL contact 19 is formed to overlap the device isolation layer 12 as shown in FIG.- 4A, which allows the BL contact plug to be formed easily in the post process.

Next, as shown in FIGS. 2B, 3B, 4B and 5B, a TiN layer 23 of, say, 5 nm in thickness, a Ti layer 24 (or W film) of, say, 400 nm in thickness and a silicon nitride film 41 of, say, 50 nm in thickness are deposited in sequence over the entire surface.

Next, as shown in FIGS. 2C, 3C, 4C and 5C, a resist film 42 is formed to cover the BL contact plug formed region and the SN contact plug formed region. Using this film as a mask, the silicon nitride film 41, the Ti layer 24 and the TiN layer 23 are etched in sequence by means of RIE by way of example, thereby forming the BL contact plug 21 and the SN contact plug 22 at the same time.

In this manner, the BL contact plug 21 and the SN contact plug 22 which are electrically connected to the contacts 19 and 20, respectively, are formed at the same time.

Although the metal plug is described here as consisting of a composite film of TiN/Ti, a composite film of TiN/W/TiN/Ti by way of example may be used instead.

Next, as shown in FIGS. 2D, 3D, 4D and 5D, after removal of the resist film 42, a silicon nitride film is deposited over the entire surface by means of CVD to a thickness of, say, about 40 nm and then etched through RIE so that the silicon nitride film is left as shown at 25 only on the sidewall of each contact plug.

Next, as shown in FIGS. 2E, 3E, 4E and 5E, a second BPSG film 26 as an interlayer insulating film is deposited over the entire surface by means of CVD to a thickness of, say, 400 nm and the entire surface of the wafer is then planarized by means of CMP. At this point, the silicon nitride film 41 on the top of each plug may be used as polishing stopper.

Figure 6:
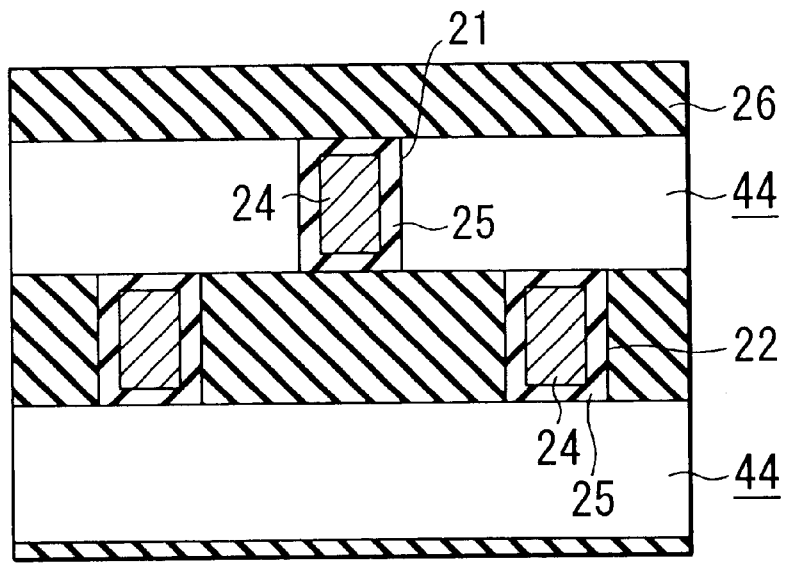
FIG. 6 is a sectional view taken along plane VI—VI of FIG. 3F.
Figure 7:
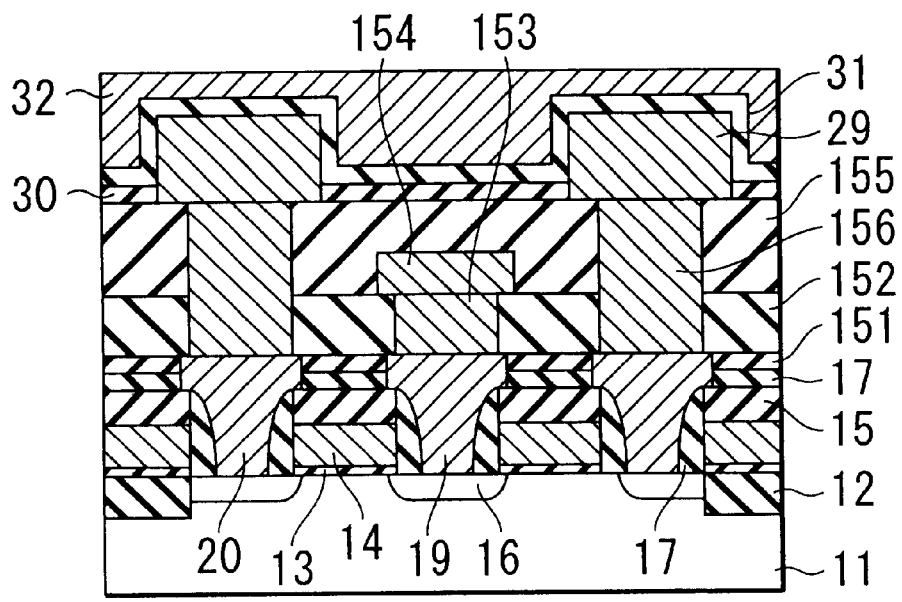
FIG. 7 shows, in a sectional view, of a memory cell of a conventional stacked DRAM.

Next, as shown in FIGS. 2F, 3F, 4F and 5F, on the second BPSG film 26 is formed a resist film 43 which has a hole formed in its portion located above a bit line to be formed later. The BPSG film 26 is then subjected to RIE to form a first trench 44 about 300 nm deep in the form of a line. The sectional view taken along the plane D–D' in FIG. 3F is shown in FIG. 6.

In this case, the contact plugs 21 and 22, having their top and sidewall covered with the silicon nitride films 25 and 41, are protected from the etching of the trench 44. Thus, it is the key point to use such a high-selectivity RIE technique as allows the BPSG film to be etched much faster (for example, at least ten times) than the silicon nitride film.

Next, as shown in FIGS. 2G, 3G, 4G and 5G, after the removal of the resist film 43, a resist film 45 having a hole in the BL contact plug area is formed again and the silicon nitride film 41 on the top of the BL contact plug 21 and the silicon nitride film 25 on the upper sidewall of the BL contact plug are then removed through RIE. At this point, the upper portion of the Ti layer 24 of the BL contact plug 21 may be etched to some extent. The etching of the upper portion of the Ti layer 24 would allow the thickness of the bit line in the area where the bit line and the BL contact plug are connected to be increased, thereby decreasing the wiring resistance of the bit line.

Next, as shown in FIGS. 2H, 3H, 4H and 5H, after the removal of the resist film 45, a composite film of W/TiN/Ti (in the drawing, only a film of W is shown) is deposited over the entire surface including the trench 44 formed in the interlayer insulating film. The CMP process is then carried out to leave the W/TiN/Ti composite film in the trench 44. Thus, the buried bit line 27 is formed in the trench through the so-called damascene process using CMP.

Though not shown, prior to the formation of bit lines, in the contact area of the peripheral circuit section as well contact holes and trenches used in forming bit lines of the memory cell section are formed using standard lithographic and RIE techniques. By so doing, contact plugs (not shown) electrically connected to source/drain diffusion layers can also be formed in the contact area of the peripheral circuit section at the same time the bit lines are formed in the memory cell section through the damascene process.

Next, as shown in FIGS. 2I, 3I, 4I and 5I, the top of the bit lines 27 is etched away by, say, about 70 mm to form second trenches 47. Next, as shown in FIGS. 2J, 3J, 4J and 5J, a silicon nitride film 28 is deposited over the entire surface to a thickness of about 200 nm and then subjected to CMP or CDE (chemical dry etching) to thereby leave the film 28 only on the bit lines 27.

Next, as shown in FIGS. 2K, 3K, 4K and 5K, a silicon nitride film 30 of a thickness of, say, 20 nm and a TEOS oxide film 48 of a thickness of, say, 400 nm are deposited in sequence over the entire surface. Next, a resist film 49 having holes formed in its areas where the storage node electrodes are formed is formed and then the TEOS oxide film 48, the silicon nitride film 30 and the silicon nitride films 41 and 25 on the surface of the SN contact plugs 22 are etched using RIE to form holes 50, thereby exposing the top and an upper portion of the sidewall of the SN contact plugs 22 buried in the second BPSG film 26.

At this point, care should be taken to ensure that the TEOS film 48 and the silicon nitride film 30 are etched substantially at an angle of 90 degrees with respect to their surface. This etching process is carried out by first etching the TEOS oxide film 48 through RIE with the silicon nitride film 30 as a stopper and then selectively etching the silicon nitride film 30 and the silicon nitride films 41 and 25 on the top and sidewall of the SN contact plug 22 by changing the etching conditions. This allows the holes in the storage node electrode pattern to be formed without overetching the second BPSG film 26 and the silicon nitride film 25, thereby exposing the top surface of the SN contact plug 22. At this point, the area, such as the peripheral circuit, where no etching is desired is allowed to be unetched by coating a resist film onto it.

Next, as shown in FIGS. 2L, 3L, 4L and 5L, a metal oxide film of perovskite structure, such as $SrRuO_3$ (hereinafter referred to as SRO), is deposited by means of sputtering or plasma CVD over the entire surface including the top and the upper sidewall of the exposed SN contact plugs 22 to a thickness of, say, 400 nm and the entire surface is then smoothed out using CMP or etchback process, thereby forming storage node electrodes 29. Although the storage node electrode material is described here as being SRO, use may be made of Ru, $RuO_2$, Pt, Re, Os, Pd, Rh, Au, Ir, or $IrO_2$ instead. In addition, a composite film of these materials may be used. Furthermore, use may be made of a film such that the grain of a metal film is stuffed with another metal such as Rh or Ir.

Next, as shown in FIGS. 2M, 3M, 4M and 5M, the TEOS oxide film 48 is selectively removed using a wet etch solution, such as $NH_4F$. At this point, the wet etching can be stopped by the silicon nitride film 30 underlying the TEOS oxide film 48. The wet etching may be carried out while covering the area, such as the peripheral circuit area, where the TEOS oxide film 48 should not be removed with a layer of resist. By so doing, the storage electrode surface in the memory cell section and the TEOS oxide surface in the other section than the memory cell section are allowed to be at the same level, thus substantially eliminating the difference in level between the memory cell area and the other area due to the presence or absence of the storage node electrodes. In the process of manufacture of stacked DRAMs, it is important to minimize the level difference.

A $(Ba, Sr) TiO_3$ film 31 is deposited at a thickness of about 20 nm over the entire surface by means of CVD by way of example and, if necessary, is subjected to crystallization annealing. An SrRuO3 film is then deposited at a thickness of about 40 mm over the entire surface by means of CVD to form a plate electrode (upper electrode) 32 of each capacitor.

A PL (plate) capping film (not shown) consisting of, say, TiN is deposited at a thickness of about 50 nm over the entire surface by means of sputtering. After that, the plate electrode 32 and the PL capping film are patterned using standard lithographic and RIE techniques. At this point, a level difference will be produced between the memory cell area and the area where no plate electrode exists as in the peripheral circuit area.

As the plate electrode 32, instead of the SRO film use may be made of an $RuO_2$ film, an Ru film, a Pt film, an Re film, an Ir film, an Os film, a Pd film, an Rh film, a precious metal film of, say, Au, their oxide film, or a perovskite conductive metal oxide film other than the SRO film. An interlayer insulating film (not shown), such as a plasma TEOS oxide film, is further deposited at a thickness of about 400 nm over the entire surface by means of CVD and then planarized by CMP. Thereby, the difference in level between the memory cell area and the peripheral circuit area can be eliminated.

After that, though not shown, contact holes are formed in desired areas and metal interconnections are formed. If necessary, multilevels of contact and metal interconnections are formed, a passivation film is formed, and bonding pad contact holes are formed, thus completing a DRAM.

The present embodiment has been described in terms of an example in which a barrier metal layer is omitted between the SN contact plug 22 and the storage node electrode 29; however, a layer of barrier metal, such as TiN, TiAlN, TaSiN, or WN, may be used. The properties required of barrier metals are the resistance to reaction between the metal plug material, such as W or TiN, and the storage electrode material, such as $SrRuO_3$ or Ru, and the resistance to oxidation. Any material that satisfies such properties can be used as a barrier metal.

As described above, since the bit line contact plugs and the SN electrode plugs are simultaneously formed into the same structure from the same materials, the following advantages are provided:

1. The manufacturing process can be simplified.

2. Since the SN contact metal plugs are formed prior to the formation of the bit lines, the shape of the SN contacts can be formed without being affected by variations in the processing of the bit lines and the SN contact plugs of low resistivity can be formed stably.

The present invention is not restricted to the above-described embodiment. For instance, since the capacitor insulating film is only required to have high permittivity, use may be made of a $Ta_2O_5$ film, a $Pb(Zr, Ti)O_3$ film, an $SrTiO_3$ film, or stacked nitride/oxide (NO) films (a composite film of $Si_3N_4/SiO_2$) besides the $(Ba, Sr)TiO_3$.

The present invention may be practiced or embodied in still other ways without departing from the scope and spirit thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a transistor having a gate electrode formed above a semiconductor substrate and source and drain regions formed in the semiconductor substrate;
   a first interlayer insulating film covering the transistor and having contact holes leading to the source region and the drain region, respectively;
   a bit line contact formed in one of the contact holes;
   a storage node electrode contact formed in the other of the contact holes;
   a bit line contact plug formed on the bit line contact;
   a storage node electrode contact plug comprising a first barrier metal layer formed on the storage node electrode contact and a first metal lay formed on the first barrier metal layer;
   a second interlayer insulating film formed on the first interlayer insulating film, the storage node electrode contact plug and a bit line contact plug being provided in the second interlayer insulating film;
   a first sidewall insulating film surrounding the first metal layer, and a material of the first sidewall insulating film being different from a material of the second interlayer insulating film;
   a bit line connected to the bit line contact plug; and
   a storage node electrode of a capacitor, connected to the storage node electrode contact plug,
   wherein the first barrier metal layer is only formed under the bottom face of the first metal layer.

2. The semiconductor memory device according to claim 1, further comprising a capacitor insulating film covering the storage electrode and the interlayer insulating film, and a plate electrode formed on the capacitor insulating film.

3. The semiconductor memory device according to claim 1, wherein the first sidewall insulating film has a top portion and the storage node contact plug has a top portion that is at a higher level than the top portion of the first sidewall insulating film.

4. The semiconductor memory device according to claim 1, wherein the bit line has a side that contacts the first sidewall insulating film.

5. The semiconductor memory device according to claim 1, wherein the bit line contact plug comprises a second barrier metal layer formed on the bit line contact and a second metal layer formed on the second barrier metal layer, and the second barrier metal layer is formed only under the bottom face of the second metal layer.

6. The semiconductor memory device according to claim 5, which further comprises a second sidewall insulating film surrounding the second metal layer and in which the interlayer insulating film comprises a first interlayer insulating film having the contact holes and a second interlayer insulating film in which the storage node electrode contact plug is provided.

7. The semiconductor memory device according to claim 5, wherein the first barrier metal layer and the second barrier metal layer are made of the same material.

8. The semiconductor memory device according to claim 1, which further comprises a capacitor insulating film covering the storage node electrode and the interlayer insulating film, and a plate electrode formed on the capacitor insulating film,
   wherein the first sidewall insulating film is in contact with a side of the first metal layer and a side of the bit line; the bit line contact plug comprises the first barrier metal layer formed on the bit line contact and the first metal layer formed on the first barrier metal layer; the first barrier metal layer is on only the bottom of the first metal layer; and the first sidewall insulating film has a top portion and the storage node contact plug has a top portion that is at a higher level than the top portion of the first sidewall insulating film.

9. The semiconductor memory device according to claim 1, which further comprises an insulating film formed on the bit line.

10. The semiconductor memory device according to claim 1, wherein the bit line has a top portion and the first sidewall insulating film has a top portion that is at a higher level than the top portion of the bit line.

11. The semiconductor memory device according to claim 10, wherein the storage node contact plug has a top portion that is at a higher level than the top portion of the first sidewall insulating film.

12. The semiconductor memory device according to claim 6, wherein the first sidewall insulating film and the second sidewall insulating film are made of the same material.

13. The semiconductor memory device according to claim 1, wherein the bit line is provided in the second interlayer insulating film.

14. A semiconductor memory device comprising:

a transistor having a gate electrode formed above a semiconductor substrate and source and drain regions formed in the semiconductor substrate;

a first interlayer insulating film covering the transistor and having contact holes leading to the source region and the drain region, respectively;

a bit line contact formed in one of the contact holes;

a storage node electrode contact formed in the other of the contact holes;

a bit line contact plug formed on the bit line contact;

a storage node electrode contact plug formed on the storage node electrode contact;

a second interlayer insulating film formed on the first interlayer insulating film, the storage node electrode contact plug and the bit line contact plug being provided in the second interlayer insulating film;

a first sidewall insulating film surrounding a first metal layer, and a material of the first sidewall insulating film being different from a material of the second interlayer insulating film;

a bit line connected to the bit line contact plug; and a storage node electrode of a capacitor, connected to the storage node electrode contact plug.

15. The semiconductor memory device according to claim 14, further comprising a capacitor insulating film covering the storage electrode and the interlayer insulating film, and a plate electrode formed on the capacitor insulating film.

16. The semiconductor memory device according to claim 14, wherein the first sidewall insulating film has a top portion and the storage node contact plug has a top portion that is at a higher level than the top portion of the first sidewall insulating film.

17. The semiconductor memory device according to claim 14, wherein the bit line has a top portion and the first sidewall insulating film has a top portion that is at a higher level than the top portion of the bit line.

18. The semiconductor memory device according to claim 17, wherein the storage node contact plug has a top portion that is at a higher level than the top portion of the first sidewall insulating film.

19. The semiconductor memory device according to claim 14, wherein the bit line has a side that contacts the first sidewall insulating film.

20. The semiconductor memory device according to claim 14, further comprising an insulating film formed on the bit line.

21. The semiconductor memory device according to claim 14, further comprising a second sidewall insulating film surrounding a second metal layer, and a material of the second sidewall insulating film being different from a material of the second interlayer insulating film.

22. The semiconductor memory device according to claim 21, wherein the first sidewall insulating film and the second sidewall insulating film are made of the same material.

23. The semiconductor memory device according to claim 14, wherein the bit line is provided in the second interlayer insulating film.

24. The semiconductor memory device according to claim 14, further comprising a capacitor insulating film covering the storage node electrode and the interlayer insulating film, and a plate electrode formed on the capacitor insulating film, wherein an insulating film is formed on the bit line; a side of the bit line contacts a side of the first sidewall insulating film; and the first sidewall insulating film has a top portion and the storage node contact plug has a top portion that is at a higher level than the top portion of the first sidewall insulating film.

25. A semiconductor memory device comprising:

a translator having a gate electrode formed above a semiconductor substrate and source and drain regions formed in the semiconductor substrate;

a first interlayer insulating film covering the transistor and having contact holes leading to the source region and the drain region, respectively;

a bit line contact formed in one of the contact holes;

a storage node electrode contact formed in the other of the contact holes;

a bit line contact plug formed on the bit line contact;

a storage node electrode contact plug having a first metal layer formed on the storage node electrode contact and a second metal layer formed on the first metal layer;

a second interlayer insulating film formed on the first interlayer insulating film, the storage node electrode contact plug and the bit line contact plug being provided in the second interlayer insulating film;

a first sidewall insulating film surrounding the first metal layer, and a material of the first sidewall insulating film being different from a material of the second interlayer insulating film;

a bit line connected to the bit line contact plug; and a storage node electrode of a capacitor, connected to the storage node electrode contact plug.

26. The semiconductor memory device according to claim 25, wherein the first metal layer is only formed under the bottom face of the second metal layer.

27. The semiconductor memory device according to claim 25, further comprising a capacitor insulating film covering the storage electrode and the interlayer insulating film, and a plate electrode formed on the capacitor insulating film.

28. The semiconductor memory device according to claim 25, wherein the first sidewall insulating film has a top portion and the storage node contact plug has a top portion that is at a higher level than the top portion of the first sidewall insulating film.

29. The semiconductor memory device according to claim 25, wherein the bit line has a top portion and the first sidewall insulating film has a top portion that is at a higher level than the top portion of the bit line.

30. The semiconductor memory device according to claim 29, wherein the storage node contact plug has a top portion that is at a higher level than the top portion of the first sidewall insulating film.

31. The semiconductor memory device according to claim 25, wherein the bit line has a side that contacts the first sidewall insulating film.

32. The semiconductor memory device according to claim 25, further comprising an insulating film formed on the bit line.

33. The semiconductor memory device according to claim 25, wherein the bit line contact plug comprises a third metal layer formed on the bit line contact and a fourth metal layer formed on the third metal layer, and the third metal layer is formed only under the bottom face of the fourth metal layer.

34. The semiconductor memory device according to claim 25, further comprising a second sidewall insulating film surrounding the second metal layer, and a material of the second sidewall insulating film being different from a material of the second interlayer insulating film.

35. The semiconductor memory device according to claim 34, wherein the first sidewall insulating film and the second sidewall insulating film are made of the same material.

36. The semiconductor memory device according to claim 34, wherein the first metal layer and the third metal layer are made of the same material.

37. The semiconductor memory device according to claim 25, which further comprises an insulating film formed on the bit line.

38. The semiconductor memory device according to claim 25, wherein the bit line is provided in the second interlayer insulating film.

39. The semiconductor memory device according to claim 25, which further comprises a capacitor insulating film covering the storage node electrode and the interlayer insulating film, and a plate electrode formed on the capacitor insulating film, wherein the first sidewall insulating film is in contact with a side of the first metal layer and a side of the bit line; the bit line contact plug comprises the third metal layer formed on the bit line contact and the fourth metal layer formed on the first metal layer; the third metal layer is only formed on the bottom of the fourth layer; and the first sidewall insulating film has a top portion and the storage node contact plug has a top portion that is at a higher level than the top portion of the first sidewall insulating film.

* * * * *

UNITED STATES PATENT AND TRADEMARK OFFICE
CERTIFICATE OF CORRECTION

PATENT NO. : 6,388,282 B1
DATED : May 14, 2002
INVENTOR(S) : Hieda

It is certified that error appears in the above-identified patent and that said Letters Patent is hereby corrected as shown below:

Column 9,
Line 60, change "lay" to -- layer --.

Signed and Sealed this

Fifteenth Day of April, 2003

JAMES E. ROGAN
*Director of the United States Patent and Trademark Office*